United States Patent [19]
Salvi et al.

[11] Patent Number: 5,697,068
[45] Date of Patent: Dec. 9, 1997

[54] SYSTEM AND METHOD FOR PROVIDING A NON-INVASIVELY TUNABLE TRANSCEIVER SYNTHESIZER

[75] Inventors: Raul Salvi, Boca Raton; John Wetters, Coral Springs; Wayne Phang, Boynton Beach, all of Fla.

[73] Assignee: Motorola, Inc., Schaumburg, Ill.

[21] Appl. No.: 490,876

[22] Filed: Jun. 15, 1995

[51] Int. Cl.⁶ .................................................. H04B 1/40
[52] U.S. Cl. ........................ 455/76; 455/67.1; 455/77
[58] Field of Search .......................... 455/76, 77, 183.1, 455/186.1, 185.1, 67.1, 115, 226.1, 191.2, 193.3, 180.4, 180.3, 67.4, 197.2, 262, 70, 71; 331/44

[56] References Cited

U.S. PATENT DOCUMENTS 5,201,063  4/1993  Tam et al. .......................... 455/226.1
5,423,070  6/1995  Vaisanen et al. ...................... 455/67.1
5,548,829  8/1996  Suzuki et al. ........................ 455/191.2

*Primary Examiner*—Edward F. Urban
*Attorney, Agent, or Firm*—Keith A. Chanroo

[57] ABSTRACT

A transceiver synthesizer includes components that enable it to be tuned non-invasively by software. The transceiver synthesizer includes a non-volatile memory (30) that can be non-invasively programmed with a digital value for each of a number of tuning variables. The digital values are converted by digital to analog converters (37, 38, 39) into tuning voltages. The tuning voltages are applied to voltage variable devices (60, 80, 95) that respond to changes in the applied tuning voltage to vary an operating characteristic thereof. The operating characteristics of the voltage variable devices (60, 80, 95) are non-invasively adjustable to tune the transceiver synthesizer for high and low port modulation deviation, reference oscillator make tolerance, automatic frequency control, reference oscillator temperature compensation etc.

25 Claims, 4 Drawing Sheets

SYSTEM AND METHOD FOR PROVIDING A NON-INVASIVELY TUNABLE TRANSCEIVER SYNTHESIZER

TECHNICAL FIELD

The present invention relates to a synthesizer in a transceiver for a selective call message communication device such as a pager and more particularly to a system and method for allowing the synthesizer to be tuned non-invasively by the receipt of digital programming information from an external test station.

BACKGROUND OF THE INVENTION

Synthesizers utilized in known radio frequency (RF) communication devices, such as an RF transmitter, have included a voltage controlled oscillator and a reference oscillator coupled together in a phase locked loop. A modulation input is coupled to both the voltage controlled oscillator and the reference oscillator wherein the voltage controlled oscillator is responsive to high frequency modulation inputs and the reference oscillator is responsive to low frequency modulation inputs. In such systems, it is desirable that a given peak to peak voltage input causes a particular change in the frequency of the signal output from the voltage controlled oscillator. If a change in frequency that is greater than the desired change results, it is possible that the communication device will enter a different communication channel than the one desired. Alternatively, if the change in frequency is too low, it will not be accurately detected and decoded by the intended receiver. Further, inbalances in the high and low frequency modulation inputs of the voltage controlled oscillator and reference oscillator can create modulation distortions.

In order to tune the synthesizer for high and low frequency modulation inputs, temperature compensation, automatic frequency control and other functions so that the device will "make tolerance", i.e. be within tolerance for worst case conditions, known synthesizers have employed laser tuned components. However, the tuning process for these components is invasive in that the device employing the synthesizer must be opened to provide access to the components for tuning. The tuning process is further time consuming and not as reliable as desired, often resulting in the need to retune the device.

SUMMARY OF THE INVENTION

In accordance with the present invention, the disadvantages of prior synthesizers have been overcome. The system and method of the present invention allows a transceiver synthesizer to be tuned non-invasively by software and more particularly by the receipt of digital programming information from an external test station. A tunable transceiver synthesizer is thus provided wherein the tuning process is lower cost, less time consuming and more reliable than heretofore possible with prior transceiver synthesizers.

More particularly, the system and method of the present invention are employed in a transceiver having a voltage controlled oscillator and a reference oscillator coupled in a phase locked loop to the voltage controlled oscillator for high and low frequency modulation inputs. The system includes a non-volatile memory that stores a number of tuning variables. The memory is capable of being written to so that the values of the stored tuning variables can be changed in a transceiver tuning process. Specifically, the memory is responsive to programming information received non-invasively from a test station to store new values for the tuning variables. A number of digital to analog converters are each coupled to the memory for receiving a respective digital tuning variable therefrom. Each of the digital to analog converters is responsive to a tuning variable to provide a tuning voltage at the output thereof. A number of voltage variable devices are coupled to the oscillators of the transceiver and each of the devices is also coupled to a digital to analog converter for receiving a tuning voltage therefrom. Each of the voltage variable devices is responsive to a change in the tuning voltage received from a digital to analog converter to vary an operating characteristic of the device so as to tune the transceiver.

These advantages and novel features of the present invention, as well as details of an illustrated embodiment thereof, will be more fully understood from the following description and the drawings.

DESCRIPTION OF THE PREFERRED EMBODIMENT

Figure 1:
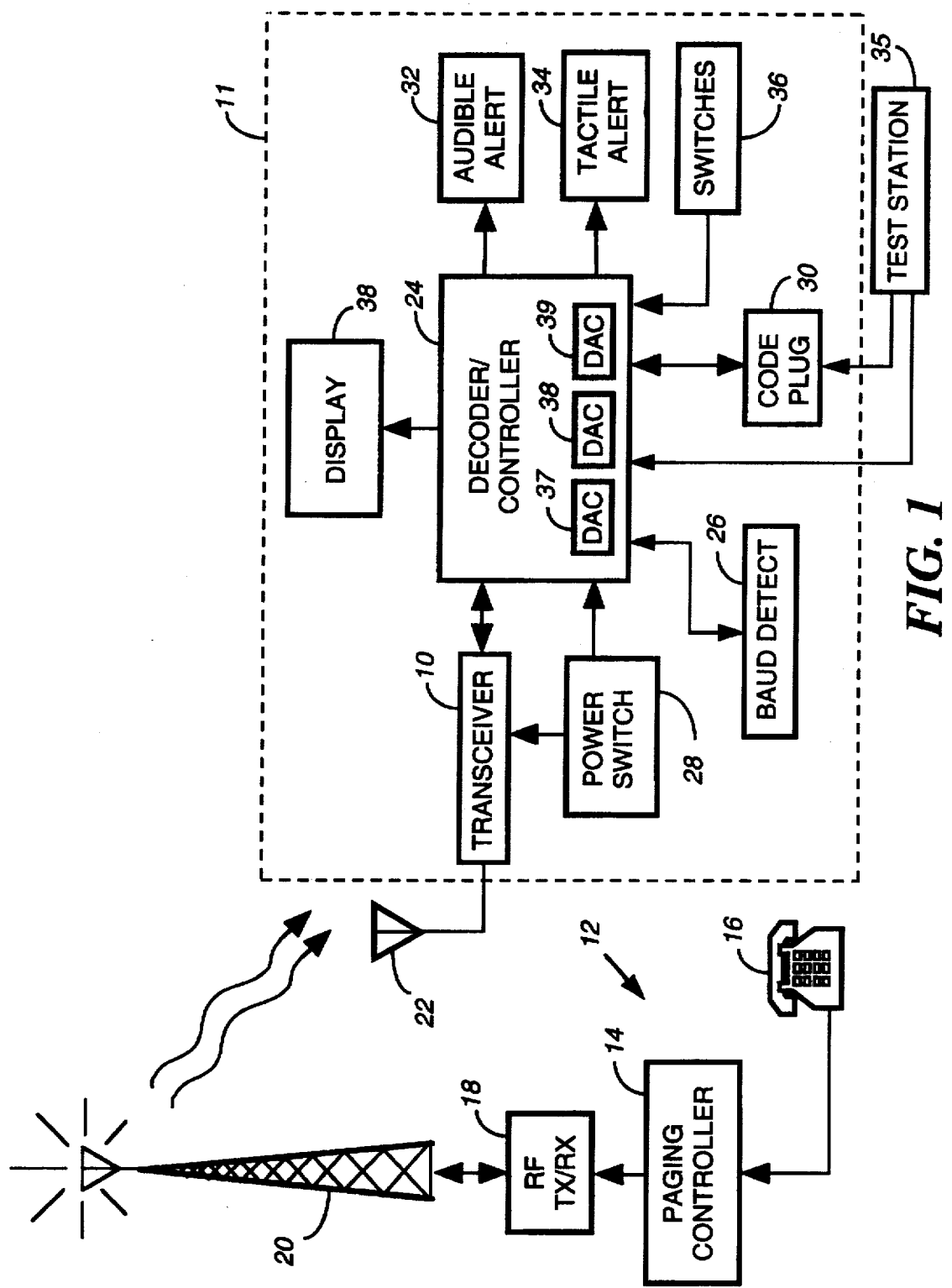
FIG. 1 is a block diagram of an RF communication network illustrating a paging device utilizing the transceiver synthesizer of a preferred embodiment of the present invention.

A transceiver 10, as shown in FIG. 1, is included in a selective call radio frequency (RF) communication device 11 that may be a pager or the like. Although the pager 11 is illustrated as receiving radio frequency signals from a paging network 12, in the preferred embodiment, the pager 11 also transmits information. Furthermore, the information transmitted and received by the pager 11 may include voice information as well as digital data.

The paging network 12 includes a paging controller 14 that receives input messages or page initiation messages from an input device such as a telephone 16. The paging controller 14 generates a paging message in accordance with a particular signalling protocol, for example, a four-level FSK signal protocol such as FLEX or REFLEX. The paging message generated by the paging controller 14 is coupled therefrom to an RF transmitter/receiver 18. The RF transmitter/receiver 18 transmits the paging message via an antenna 20 for reception by a particular pager 11 in accordance with an identification of the pager that is included in the paging message.

The pager 11 includes an antenna 22 for intercepting transmitted RF signals and for transmitting RF signals. The antenna 22 couples a received signal to the transceiver 10 wherein the transceiver 10 produces a data stream representative of a demodulated received signal that is coupled to a decoder/controller 24. The transceiver 10 is also responsive to a modulation input such as data, received from the decoder/controller 24 to frequency modulate a carrier signal for transmission out from the pager 11. The transceiver 10 further receives an automatic frequency control (AFC) signal from the decoder/controller 24 to control the frequency of a reference local oscillator contained in the transceiver 10 as described below.

As is well known in the art, the decoder/controller 24 may include a central processing unit such as a microprocessor or the like for processing demodulated signal information in accordance with software stored in a memory of the decoder/controller 24. The decoder/controller 24 is also responsive to inputs from one or more switches 36 or other input devices to generate data that is coupled to the transceiver 10 for transmission. A baud detector 26 is coupled to the decoder/controller 24 in order to detect the baud rate of a received paging signal as is well known in the art. A power switch 28 is also coupled to the decoder/controller in order to control the supply of power to the transceiver 10 thereby providing a battery saving function.

The RF signals transmitted by the network 12 typically include an address that identifies a particular pager 11 as well as an associated alpha and/or numeric message. The decoder/controller 24 decodes a received address by comparing it with one or more addresses stored in a code plug or code memory 30. The code plug or code memory 30 is a non-volatile memory that can be written to so as to change the pager address information as well as other information that may be stored in the memory as discussed below. If the decoder/controller 24 detects a match between a received address and a stored address, an alert signal is generated to alert a user that a page has been received by the device 11. The alert signal is directed to an audible alerting device 32 for generating an audible alert or to a tactile alerting device 34 for generating a silent vibrating alert. The switches 36 may be actuated by a user to select between the audible alert 32 and the tactile alert 34 as well as for causing a message stored in the memory of the decoder/controller 24 to be accessed for display on a display 38. The switches 36 may also provide additional functions such as reset, read, delete, etc. as is well known.

In order to provide a non-invasively tunable transceiver, the decoder/controller 24 includes a number of digital to analog converters 37, 38 and 39 that receive digital programming information used to control the transceiver 10 during the tuning process of the device 11. The digital programming information may include a digital value for a tuning variable. Each of the digital to analog converters is responsive to the receipt of a digital tuning variable value to provide a tuning voltage at its output representing the digital value. The output of each of the digital to analog controllers is coupled to a voltage variable device that is responsive to variations in the tuning voltage to change an operating characteristic of the device such as its capacitance or resistance in order to tune the transceiver 10.

The digital values for the tuning variables may be received by the digital to analog converters 37–39 from the code plug or code memory 30. As is well known, the code plug/memory 30 includes a port on the device 11 that is non-invasively accessible by a programmer so that new pager address information can be written to the memory 30 and stored therein. In accordance with the present invention, an external test station 35 also programs the code plug/memory 30 non-invasively using the code plug port. Specifically, the test station 35 programs new values for the tuning variables into the code plug/memory 30 of the device 11 during the tuning process using the code plug port. The new tuning variable values stored in the code plug/memory 30 are applied to respective digital to analog converters 37–39 so as to change the tuning voltages for the voltage variable devices. New values are programmed into the memory 30 until the synthesizer is appropriately tuned. The external test station 35, for example, may include equipment to monitor the operation of the device 11 with each change in the tuning variables to determine when the device 11 is properly tuned. Once it is determined that the device 11 is properly tuned, the current values of the tuning variables remain in the code plug/memory 30 so that the proper tuning voltage is output from the digital to analog converters to maintain the transceiver tuned. It is noted that instead of using the code plug/memory 30 to store the tuning variables, the decoder/controller 24 itself can include a non-volatile memory that is capable of being written to non-invasively as will be apparent to one of ordinary skill in the art.

Figure 2:
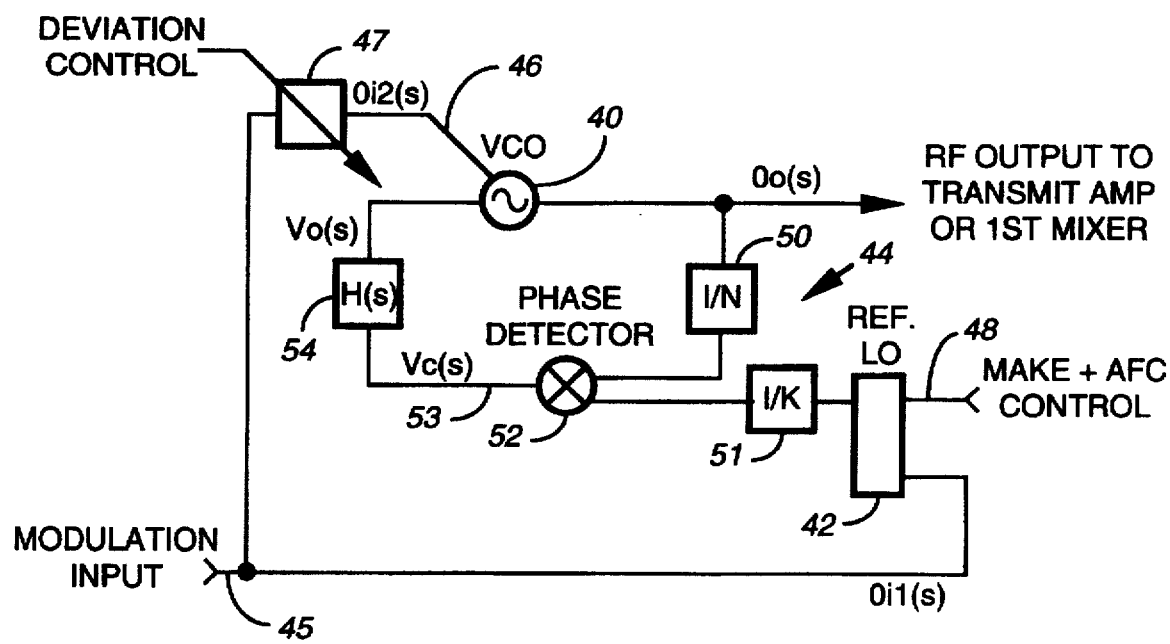
FIG. 2 is a block diagram of a synthesizer loop of the transceiver of FIG. 1.

The transceiver 10 includes a voltage controlled oscillator (VCO) 40, as shown in FIG. 2, coupled to a reference local oscillator 42 in a synthesizer or phase locked loop 44 having modulation inputs received on a line 45. The VCO 40 is responsive to high frequency modulation inputs whereas the reference local oscillator 42 is responsive to low frequency modulation inputs to allow the transceiver 10 to operate over a wide band for both voice and data communications. The VCO 40 modulates the frequency of a carrier signal with data represented by a modulation input signal applied to the VCO 40 on line 46 from a deviation control unit 47. As discussed below, the deviation control unit 47 is tunable to balance the high frequency and low frequency input ports to provide a substantially constant output deviation for a given variation in the modulation input. The VCO 40 is locked in phase to the output of the reference local oscillator 42 by the loop 44. The output of the reference local oscillator 42 has a frequency which is controlled by an automatic frequency control signal applied thereto on a line 48. The output from the reference local oscillator 42 is applied to a phase detector 52 for comparison to the output of the voltage controlled oscillator 40 which may be coupled to the detector 52 by a divider 50. The divider 50 divides the frequency of the signal output from the VCO 40 by N and a divider 51 divides the frequency of the signal output from the reference local oscillator 42 by K so as to bring the output of the VCO 40 into the frequency range of the reference local oscillator 42. The phase detector 52 is responsive to the scaled VCO and reference local oscillator outputs to provide a phase error signal on a line 53. The phase error signal on line 53 is coupled to a loop filter 54 having a low pass response. The output of the loop filter 54 is then coupled to the VCO 40 to drive the VCO 40 in phase with the reference local oscillator 42.

Figure 3:
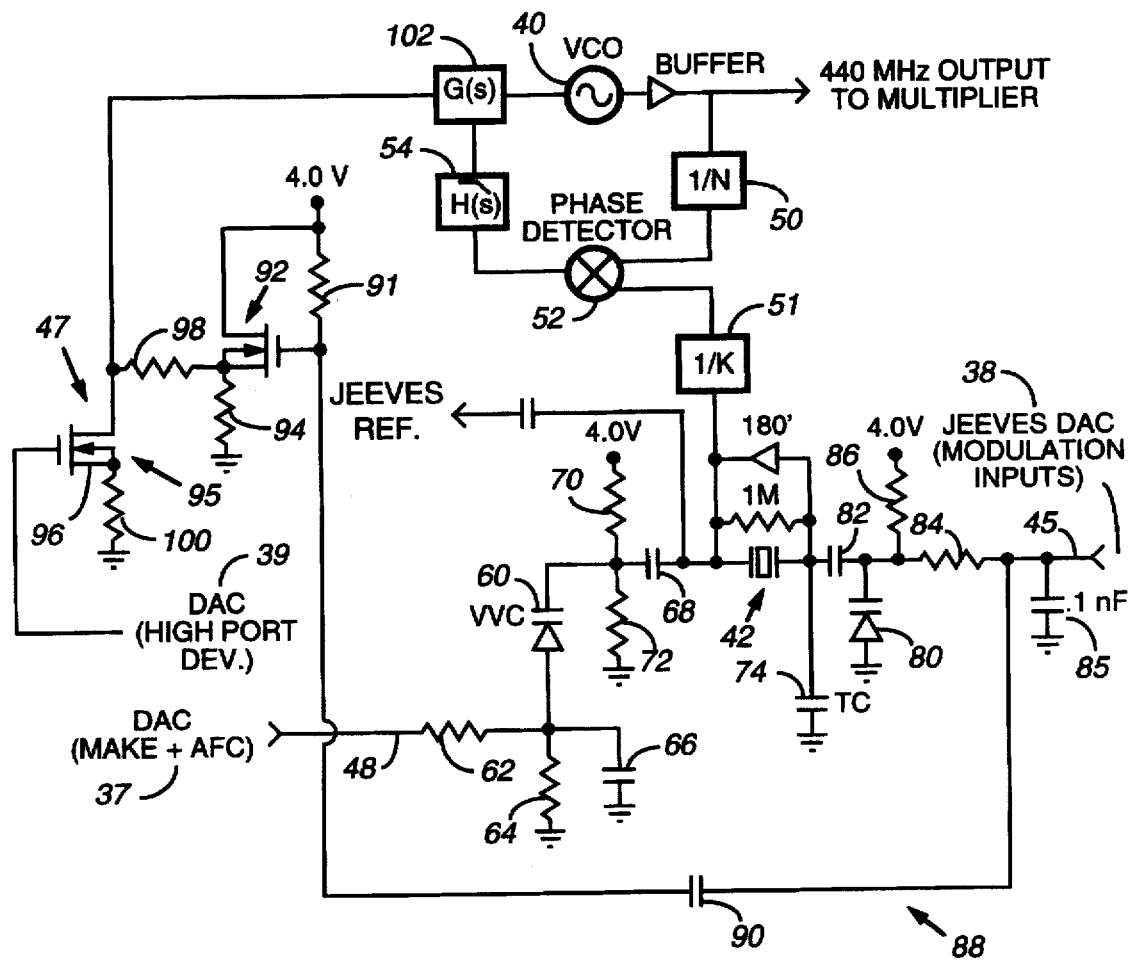
FIG. 3 is a circuit diagram of the synthesizer loop of FIG. 2 illustrating a number of voltage variable devices.

In order to tune the synthesizer as shown in FIG. 2 for automatic frequency control and so that the synthesizer will "make tolerance", i.e. will be within tolerance for worst case parameters, the transceiver synthesizer, as shown in FIG. 3, receives a tuning voltage from the digital to analog converter 37 at the automatic frequency control input on line 48. The tuning voltage from the digital to analog converter 37 is applied to a voltage variable capacitor (VVC) 60 via a 100 k ohm resistor 62 that is connected in series with the output from the digital to analog converter 37, the resistor 62 being connected to the parallel combination of a 1M ohm resistor 64 and a 220 pF capacitor 66. The VVC 60 is coupled to the reference local oscillator 42 via a 220 pF capacitor 68 and a 1M ohm resistor 70 connected in series with a 750 k ohm resistor 72 between 4.0 volts and ground. The test station 35 varies the value of the tuning variable coupled to the digital to analog converter 37 so as to in turn vary the voltage applied across the VVC 60 for tuning the reference local oscillator 42 to a desired frequency at room temperature. A temperature compensation capacitor 74 is coupled between the oscillator 42 and ground to automatically provide course adjustments for temperature variations. Once the test station 35 determines that the synthesizer is tuned for "make tolerance" and automatic frequency control with a particular value of the tuning variable being coupled to the circuit via the digital to analog converter 37, that value for the tuning variable remains in the code plug/memory 30 so as to maintain the circuit tuned.

In order to tune the synthesizer for low frequency modulation inputs, a varactor 80 is coupled to the reference local oscillator 42 via a 22 pF capacitor 82. The digital to analog converter 38 is responsive to various tuning variable values written into the code plug/memory 30 from the test station 35 so as to vary the tuning voltage applied across the varactor 80 during the tuning process. More particularly, the output of the digital to analog converter 38 is tied to the modulation input line 45. The line 45 is connected to ground through a 0.1 nF capacitor 85. The line 45 is also coupled to the varactor 80 through a 470 k ohm resistor 84 to which is tied a 1M ohm resistor 86 that is coupled to 4.0 volts. As the voltage across the varactor 80 changes with new values of the tuning variable stored in the code plug/memory 30 for the digital to analog converter 38, the capacitance of the varactor changes to vary the frequency of the reference local oscillator 42 for tuning thereof for low frequency inputs.

The modulation input on line 45 is coupled along the high frequency channel 88 via a 0.22 µF capacitor 90 coupled to the gate of a MOSFET 92. The gate of the MOSFET 92 is also coupled to 4.0 volts through a 4.7M ohm resistor 94 wherein the drain of the transistor 92 is coupled to 4.0 volts as well. The source of the MOSFET 92 is coupled to ground through a 220 k ohm resistor 94 and is also coupled to a MOSFET voltage divider circuit 95. The MOSFET voltage divider circuit 95 includes a 220 k ohm resistor 98 coupled to the drain of a MOSFET 96 and a resistor 100 coupled to the source of the MOSFET 96. The voltage divider circuit and in particular the MOSFET 96 and resistor 100 form a variable voltage device that is coupled via the gate of the MOSFET 96 to the tuning voltage output from the digital to analog convertor 39. The output of the MOSFET voltage divider circuit is coupled to the VCO 40 via a high pass filter 102 so as to tune the synthesizer for high frequency modulation inputs. More particularly, as the test station 35 varies the value of the high port tuning variable stored in the code plug/memory 30 to tune the synthesizer for high frequency modulation inputs, the voltage output from the digital to analog converter 39 varies causing the MOSFET 96 and resistor 100 to vary the apparent resistance thereof. The MOSFET 96 and resistors 98 and 100 thus provide a variable voltage divider that is tuned for high frequency modulation inputs and to balance the high frequency input channel with the low frequency input channel.

Figure 4:
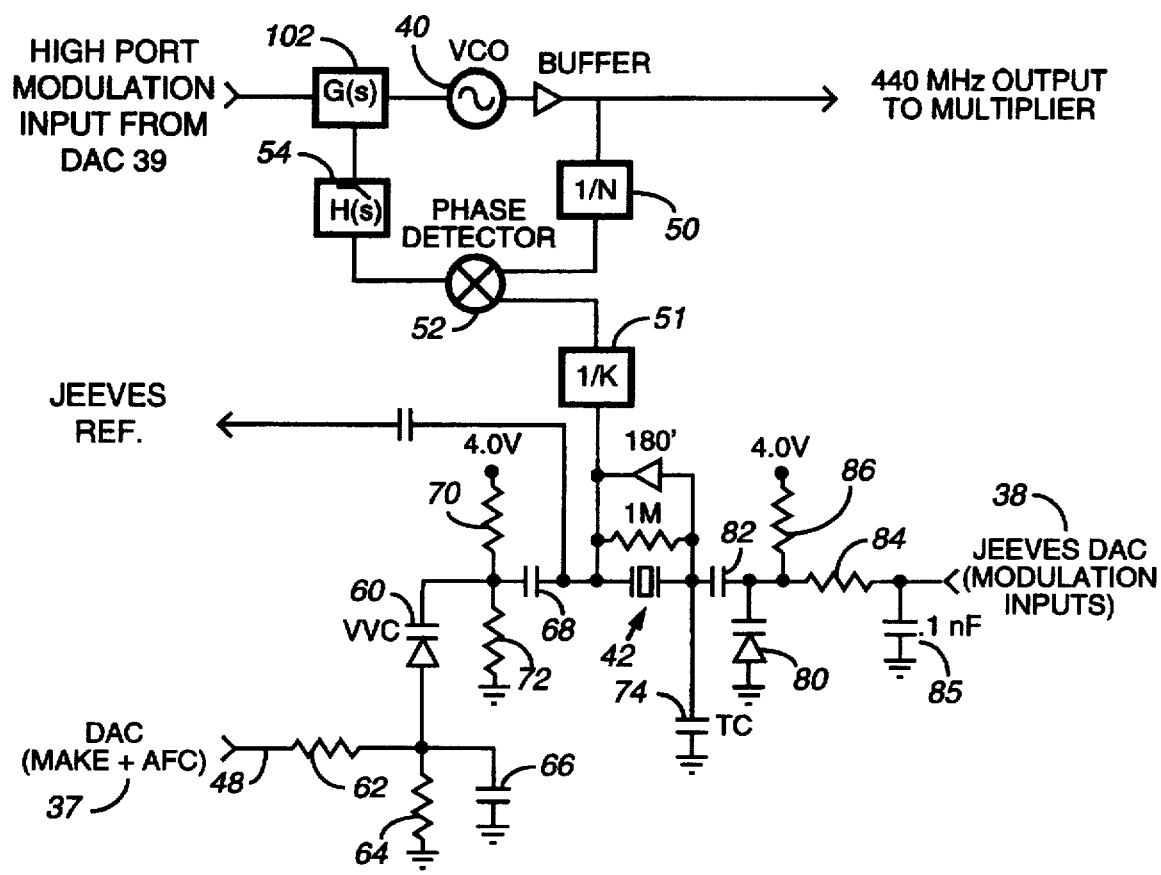
FIG. 4 is a circuit diagram of a second embodiment of the synthesizer loop of the present invention.

In a second embodiment of the present invention, the modulating inputs for the high port and low port are applied from two separate sources as shown in FIG. 4 in order to eliminate the FET attenuator and buffer circuit shown in FIG. 3. More particularly, the digital to analog converter 38 provides the low port modulation input as described above. However the digital to analog converter 39 generates an AC signal representing the high port modulation input that is applied to the voltage controlled oscillator 40 via a high pass filter 102. The AC signal output from the digital to analog converter 39 and applied as the high port modulation input is synchronized in phase and magnitude to the low port modulation input from the digital to analog converter 38. However, both the magnitude and phase of each of the outputs from the digital to analog converters 38 and 39 are independently adjustable. Further, the filtering of the high and low modulation input ports may be accomplished independently by a digital signal processor coupled to the digital to analog converters or with external discrete components.

The present invention eliminates the need to manually adjust circuit tuning components. Instead, the circuit's tuning components are adjusted non-invasively by software and in particular by programmed digital values representing the magnitudes of tuning voltages or the like that are applied to the tuning components. The resulting tuning process is less costly, less time consuming and more reliable than heretofore possible. Many modifications and variations of the present invention are possible in light of the above teachings. Thus, it is to be understood that, within the scope of the appended claims, the invention may be practiced otherwise than as described hereinabove.

What is claimed and desired to be secured by Letters Patent is:

1. In a transceiver having a voltage controlled oscillator and a reference oscillator coupled in a phase locked loop to the voltage controlled oscillator for high and low frequency modulation inputs, a system for allowing said transceiver to be tuned by receipt of digital information from an external test station comprising:

a non-volatile memory capable of being written to for storing a plurality of tuning variables, said memory being responsive to said test station to store new values for said tuning variables;

a plurality of digital to analog converters coupled to said memory for receiving respective digital tuning variables therefrom, each of said digital to analog converters being responsive to a tuning variable to provide a tuning voltage at the output thereof; and a plurality of voltage variable devices coupled to said oscillators wherein at least one of said voltage variable devices includes a variable voltage divider circuit, said at least one voltage devices includes a field effect transistor having a drain coupled to a resistor and a gate coupled to one of said digital to analog convertors for receiving a tuning voltage therefrom to provide a variable resistance device wherein each of said devices being coupled to a digital to analog converter for receiving a tuning voltage therefrom and each device being responsive to changes in said tuning voltage to vary an operating characteristic thereof to tune said transceiver.

2. A transceiver system as recited in claim 1 wherein at least one of said voltage variable devices is a varactor.

3. A transceiver system as recited in claim 1 wherein at least one of said voltage variable devices is a voltage variable capacitor.

4. A transceiver system as recited in claim 1 wherein said variable voltage divider includes a field effect transistor having a gate coupled to the output of a digital to analog converter, a source coupled to a first resistor and a drain coupled to a second resistor.

5. A transceiver system as recited in claim 4 wherein said variable voltage divider has a high frequency modulation input and an output coupled to said voltage controlled oscillator.

6. A transceiver system as recited in claim 1 wherein said reference oscillator includes an input for an automatic frequency control signal to control the frequency of said local oscillator and at least one of said voltage variable devices is coupled to said reference oscillator to tune said reference oscillator for said automatic frequency control.

7. A transceiver system as recited in claim 6 wherein said voltage variable device coupled to said reference oscillator is a voltage variable capacitor.

8. A transceiver system as recited in claim 1 wherein at least one of said voltage variable devices is coupled to said reference oscillator to tune said reference oscillator for low frequency modulation inputs.

9. A transceiver system as recited in claim 8 wherein said voltage variable device coupled to said reference oscillator is a varactor.

10. A transceiver system as recited in claim 1 wherein at least one of said voltage variable devices is coupled to said voltage controlled oscillator to tune said voltage controlled oscillator for high frequency modulation inputs.

11. A transceiver system as recited in claim 10 wherein said voltage variable device coupled to said voltage controlled oscillator includes a field effect transistor having contact coupled to a resistor and a gate coupled to one of said digital to analog converters to receiving a tuning voltage therefrom.

12. A transceiver system as recited in claim 1 wherein at least one of said voltage variable devices is a voltage variable capacitor coupled to said reference oscillator to tune said transceiver system for a worst case set of parameters.

13. A transceiver system as recited in claim 12 including a temperature compensation capacitor coupled to said reference oscillator to provide an automatic adjustment for temperature variations.

14. A transceiver system as recited in claim 1 wherein at least one of said digital to analog converters is coupled to said voltage controlled oscillator to provide a high frequency modulation input and another of said digital to analog converters is coupled to said reference oscillator to provide a low frequency modulation input, said high and low frequency modulation inputs being independently adjustable.

15. In a transceiver having a voltage controlled oscillator and a reference oscillator coupled in a phase locked loop to the voltage controlled oscillator for high and low frequency modulation inputs, a system for allowing said transceiver to be tuned by receipt of digital information;

a memory for storing digital values representing at least one tuning variable, said memory being non-invasively updatable to store new values for said tuning variable;

a digital to analog converter coupled to said memory for converting a digital tuning variable value to an analog tuning signal at said converter's output; and at least one variable device coupled to one of said oscillators and to the output of said digital to analog converter for varying an operating characteristic of said variable device in response to a change in said analog tuning signal wherein said variable device includes a variable voltage divider circuit, said variable device includes a field effect transistor having a gate coupled to said digital to analog converter and a drain coupled to a resistor.

16. A transceiver system as recited in claim 15 wherein said variable device is a varactor.

17. A transceiver system as recited in claim 15 wherein said variable device is a voltage variable capacitor.

18. A transceiver system as recited in claim 15 wherein said variable voltage divider includes a field effect transistor having a gate coupled to the output of a digital to analog converter, a source coupled to a first resistor and a drain coupled to a second resistor.

19. A transceiver system as recited in claim 18 wherein said variable voltage divider has a high frequency modulation input and an output coupled to said voltage controlled oscillator.

20. A transceiver system as recited in claim 15 wherein said reference oscillator includes an input for an automatic frequency control signal to control the frequency of said local oscillator and said voltage variable devices is coupled to said reference oscillator to tune said reference oscillator for said automatic frequency control.

21. A transceiver system as recited in claim 15 wherein said voltage variable devices is coupled to said reference oscillator to tune said reference oscillator for low frequency modulation inputs.

22. A transceiver system as recited in claim 15 wherein said voltage variable devices is coupled to said voltage controlled oscillator to tune said voltage controlled oscillator for high frequency modulation inputs.

23. A transceiver system as recited in claim 15 wherein at least one of said voltage variable devices is a voltage variable capacitor coupled to said reference oscillator to tune said transceiver system for a worst case set of parameters.

24. A transceiver system as recited in claim 23 including a temperature compensation capacitor coupled to said reference oscillator to provide an automatic adjustment for temperature variations.

25. A transceiver system as recited in claim 15 wherein at least one of said digital to analog converters is coupled to said voltage controlled oscillator to provide a high frequency modulation input and another of said digital to analog converters is coupled to said reference oscillator to provide a low frequency modulation input, said high and low frequency modulation inputs being independently adjustable.

* * * * *